United States Patent [19]
Lang

[11] Patent Number: 5,179,568
[45] Date of Patent: Jan. 12, 1993

[54] SELF-COLLIMATED UNSTABLE RESONATOR SEMICONDUCTOR LASER

[75] Inventor: Robert J. Lang, Altadena, Calif.

[73] Assignee: The United States of America as represented by the United States National Aeronautics and Space Administration, Washington, D.C.

[21] Appl. No.: 751,440

[22] Filed: Aug. 28, 1991

[51] Int. Cl.$^5$ .............................................. H01S 3/08
[52] U.S. Cl. ..................................................... 372/95
[58] Field of Search ............................ 372/95, 99, 101

[56] References Cited

U.S. PATENT DOCUMENTS

| | | | |
|---|---|---|---|
| 4,553,244 | 11/1985 | Benedict et al. | 372/95 |
| 4,769,614 | 9/1988 | Oughstun | 372/95 |
| 5,058,123 | 10/1991 | Yasui et al. | 372/95 |

OTHER PUBLICATIONS

A. E. Siegman, "Unstable Optical Resonators for Laser Applications," Proceedings of the IEEE, 53, pp. 277–287, Mar. 1965.
M. L. Tilton, et al., "High Power, Nearly Diffraction-Limited Output from a Semiconductor Laser with an Unstable Resonator," Conf. on Lasers and ElectroOptics, Washington, D.C. Jan. 1991.
R. J. Lang, et al., "Unstable resonator semiconductor lasers-Part 1: Theory," IEE Proceedings, vol. 134, Pt. J, No. 1, pp. 69–75, Feb. 1987.
J. Salzman, et al., "Unstable resonator semiconductor lasers-Part 2: Experiment," IEE Proceedings, vol. 134, Pt. J, No. 1, pp. 76–86 Feb. 1987.
J. Salzman, et al., "Confocal unstable-resonator semiconductor laser," Optics Letters, vol. 11, No. 8, pp. 507–509, Aug. 1986.
A. P. Bogatov, et al., "Injection laser with an unstable resonator," Sov. J. Quantum Electron., 10, pp. 630–622, Jan. 1970.

*Primary Examiner*—John D. Lee
*Assistant Examiner*—Robert E. Wise
*Attorney, Agent, or Firm*—John H. Kusmiss; Thomas H. Jones; Guy M. Miller

[57] ABSTRACT

Self-collimation of the output is achieved in an unstable resonator semiconductor laser by providing a large concave mirror $M_1$ and a small convex mirror $M_2$ on opposite surfaces of a semiconductor body of a material having an effective index of refraction denoted by n, where the respective mirror radii $R_1$, $R_2$ and beam radii $r_1$, $r_2$ are chosen to satisfy a condition $$\frac{R_2}{1 + r_1} = \frac{n - 1}{n},$$

with a value of geometric magnification $$1 \leq M \leq \frac{n + 1}{n - 1}$$

where $r_1$ and $r_2$ are the radii of counterpropagating beams at respective mirrors of radii $R_1$ and $R_2$.

7 Claims, 3 Drawing Sheets

SELF-COLLIMATED UNSTABLE RESONATOR SEMICONDUCTOR LASER

ORIGIN OF INVENTION

The invention described herein was made in the performance of work under a NASA contract, and is subject to the provisions of Public Law 96-517 (35 USC 202) in which the contractor has elected not to retain title.

TECHNICAL FIELD

The invention relates to an unstable resonator semiconductor laser, and more particularly to an architecture for self-collimation of a narrow output beam of such a laser.

BACKGROUND ART

Unstable resonators are traditionally applied to high-power lasers, and the self-collimated unstable resonator laser to be described herein is intended for use in applications which require high power in the range from about 0.5 W to at least about 10 W.

There is a pressing need in various applications for high-power, single-lateral-mode diode lasers; they include pumps for optical fiber amplifiers in telecommunications, pumps for solid-state lasers and direct sources for space optical communications. Heretofore, only phased arrays have approached the necessary power for these applications while maintaining single-lateral mode. A diode laser that could demonstrate even half a watt continuous power in a narrow collimated beam would be in great demand in the field of telecommunications alone.

In the past, all but one of the known unstable resonant semiconductor lasers have used diverging and/or flat mirrors for the resonant cavity. This results in a strongly diverging beam that must be externally collimated with a large numerical aperture lens to achieve a narrow diffraction limited beam. The only known unstable resonant laser with a collimated beam utilizes a confocal structure in which the light is coupled out through a separate facet, as shown in FIGS. 1a and 1b. See J. Salzman, R. Lang, A. Larson and A. Yariv, "Confocal unstable-resonator semiconductor laser," Optics Letters, Vol. 11, No. 8, pp. 507–509 (August 1986). The result is two beams, each of half power separated by the totally reflecting convex mirror $M_2$.

In semiconductor lasers, a Fabry-Perot cavity is normally provided using two flat parallel mirrors (cleaved surfaces), a condition which lies on the boundary of g parameters between stable and unstable optical resonance, as shown in FIG. 2a from A. E. Siegman, "Unstable Optical Resonators for Laser Applications," Proc. IEE, Vol. 53, pp. 277–287 (March 1965). If the distance between the two mirrors is denoted by L, as shown in FIG. 2b, and the mirror radii of curvature of mirrors $M_1$ and $M_2$ by $R_1$ and $R_2$, any given resonator may be represented by a single point in the $g_1$, $g_2$ plane, such as that labeled PLANAR in FIG. 2a.

Using the convex mirror geometry illustrated in FIG. 3, g-parameter analysis shows that the radii $r_1$ and $r_2$ of the beams reflected by cavity mirrors $M_1$ and $M_2$, the geometric magnification M can be determined as a function of the mirror radii $R_1$ and $R_2$ from a set of g parameters defined as $$g_1 \equiv 1 - \frac{1}{R_1}, g_2 \equiv 1 - \frac{1}{R_2} \tag{1}$$

where $R_1$ and $R_2$ are normalized to the distance separating the centers of the mirrors. Then, according to Siegman's formalism, the centers of curvature of the beams and geometric magnification are given by:

$$r_1 = \frac{\sqrt{1 - g_1^{-1}g_2^{-1}} - (1 - g_1^{-1})}{(1 - g_1^{-1}) + (1 - g_2^{-1})}, \tag{2}$$

$$r_2 = \frac{\sqrt{1 - g_1^{-1}g_2^{-1}} - (1 - g_2^{-1})}{(1 - g_1^{-1}) + (1 - g_2^{-1})}$$

and $$M = \frac{1 + \sqrt{1 - g_1^{-1}g_2^{-1}}}{1 - \sqrt{1 - g_1^{-1}g_2^{-1}}} \tag{3}$$

This g-parameter analysis applies to the concave mirror geometry of FIG. 2b and the concave-convex mirror geometry of FIG. 1b as well.

The most important parameter in the design of an unstable resonator is the magnification M, which, in the limit of a large Fresnel number, determines the cavity losses and thus the required threshold gain. When designing an unstable resonator, it is desirable to begin with the value of M, the specification of the magnification, and derive the necessary mirror radii $R_1$ and $R_2$ with the additional degree of freedom being determined by some other requirement, e.g., the mirror or beam radii. Positive radius $R_1$ or $R_2$ corresponds to curvature of the mirror $M_1$ or $M_2$ toward the resonator cavity, i.e., to a concave mirror, while a negative radius value corresponds to a convex mirror. Inverting Equations (1)–(3) to solve for the mirror radii as a function of M, however, is difficult. To simplify the mathematics, an alternate set of parameters $\alpha$ and $\beta$ are introduced, for which expressions for mirror and beam radii are easily derivable from the magnification and which yield simple, easily manipulable expressions. The alternate set of parameters are defined as:

$$\alpha \equiv \sqrt{1 - g_1^{-1}g_2^{-1}}, \beta \equiv 1 - g_2^{-1}. \tag{4}$$

Then algebraic substitution of Equation (4) into Equations (1)–(3) yields the following expressions:

$$\alpha = \frac{M-1}{M+1}, M = \frac{1+\alpha}{1-\alpha}, \tag{5}$$

$$R_1 = \frac{\alpha^2 - 1}{\alpha^2 - \beta}, R_2 = \frac{\beta - 1}{\beta}, \tag{6}$$

$$r_1 = \frac{1-\alpha}{\alpha - \beta}, r_2 = \frac{1-\beta}{\alpha + \beta}. \tag{7}$$

According to the definition in Equation (4), $\alpha$ must be positive and real to achieve an unstable resonator (imaginary $\alpha$ corresponds to a stable resonator), while $\beta$ can take on any real value.

To put this to practical use, choose a magnification M, calculate $\alpha$ from Equation (6) and then by varying the parameter $\beta$, see the effects on mirror and beam radii. As an example, calculate the condition for self-collimation of an unstable resonator made of a material with index of refraction denoted by n. FIG. 4 is a ray diagram showing the refraction of a ray as it goes through a mirror of radius $R_2$ and is subsequently collimated. From the diagram it is seen that in the paraxial approximation (where $\sin\theta \approx \theta$), a ray traveling at angle $\phi$ with the optical axis hits the mirror $M_2$ at an angle $(\theta-\phi)$ from the normal; as the ray exits the medium having an index of refraction n, this will be magnified by Snell's law to an angle $n(\theta-\phi)$ which should be equal to $\theta$ in order to be collimated. This relation is then combined with the relations between $\theta$, $\phi$, and the geometry of the resonator $$\theta \approx \frac{d}{1+r_1}, \phi \approx \frac{d}{R_2}, \quad (8)$$

to get the condition for self-collimation:

$$\frac{R_2}{1+r_1} = \frac{n-1}{n}. \quad (9)$$

A geometric construction similar to FIG. 3 would show that Equation (9) holds for a concave mirror having negative values of $R_2$ as well.

Expressing the relationship of Equation (9) in terms of g-parameters gives the following complex algebraic expression that is difficult to solve:

$$\frac{g_2^{-1}[(1-g_1^{-1}) + (1-g_2^{-1})]}{1-g_2^{-1})\left[\sqrt{1-g_1^{-1}g_2^{-1}} - (1-g_2^{-1})\right]} = \frac{n-1}{n}. \quad (10)$$

However, expressing this relationship in terms of $\alpha$ and $\beta$ gives a much simpler condition:

$$\beta = \alpha n. \quad (11)$$

The index of refraction n is determined by the material through which the light passes out of the laser, so for an GaAs/AlGaAs laser, for example, n is the effective index of the waveguide heterostructure, about 3.4. Substituting Equation (11) into Equations (6) and (7) gives mirror and beam radii for the self-collimating geometry. They will be functions solely of $\alpha$, which is directly related to the magnification M and index of refraction n.

$$R_1 = \frac{\alpha^2 - 1}{\alpha(\alpha - n)}, R_2 = \frac{n\alpha - 1}{n\alpha}, \quad (12)$$

$$r_1 = \frac{1-\alpha}{\alpha(1-n)}, r_2 = \frac{1-n\alpha}{\alpha(1+n)}, \quad (13)$$

If $r_1$ or $r_2$ lie in the interval $[-1,0]$, then the resonator has a focal spot between the mirrors. This is undesirable because high optical powers can cause self-focusing and/or optical damage at the focal spot. Examination of Equation (13) reveals that $$r_1 \in [-1,0] \text{ for } \alpha \in [1/n,1] r_2 \in [-1,0] \text{ for } \alpha > 1/n. \quad (14)$$

Comparing these conditions on $\alpha$ to the relation between $\alpha$ and the magnification M from Equation (5), shows that there will always be at least one internal focal spot unless $\alpha < 1/n$, or $$1 \leq M \leq \frac{n+1}{n-1}. \quad (15)$$

For a typical AlGaAs waveguide (n=3.4), the critical value of magnification occurs at M=1.833, a value determined by the index of refraction of the laser medium above which there is no self-collimating geometry possible without an internal focal spot. However, for lower magnifications, a self-collimating unstable resonator is indeed possible, as will be described below as an example of the present invention with reference to FIGS. 5a and 5b.

A new formalism for geometric analysis of unstable resonators has been presented which yields the self-collimation condition of an unstable semiconductor resonator. Such a laser would, in principle, have a collimated, diffraction-limited output beam and be capable of high output power. It should be noted at the outset that while a specific example of the invention is described below with reference to a planar (2-dimensional) unstable resonator laser, the principles are easily extendable to 3-dimensional unstable resonator lasers.

STATEMENT OF THE INVENTION

An object of this invention is to provide a geometry for a self-collimated unstable resonator semiconductor laser which uses refraction to collimate the output beam.

In accordance with the present invention, this is achieved in a semiconductor laser by providing a large concave mirror $M_1$ and a small convex mirror $M_2$ on opposite surfaces of a semiconductor body of a material having an index of refraction denoted by n, where the respective mirror radii $R_1$, $R_2$ and reflectivities (beam radii) $r_1$, $r_2$ are chosen according to Equations (1) through (12) and (13) with a value of geometric magnification $$1 \leq M \leq \frac{n+1}{n-1}$$

to satisfy a condition:

$$\frac{R_2}{1+r_1} = \frac{n-1}{n},$$

where $r_1$ and $r_2$ are the radii of counterpropagating beams at respective mirrors of radii $R_1$ and $R_2$, for self-collimation of the output beam through the mirror $M_2$.

BRIEF DESCRIPTION OF THE DRAWINGS

FIG. 1a illustrated in an isometric view a prior-art unstable resonant semiconductor laser with a confocal structure for collimated light in which the light is coupled out through separate facets in two parallel beams of half power to be compared with the present invention shown in FIG. 5a.

FIG. 2b illustrates a geometry for two concave mirrors of a resonant cavity used in the discussion of FIG. 2a.

FIG. 5b illustrates the geometry of the unstable resonant semiconductor laser of FIG. 5a.

DETAILED DESCRIPTION OF THE INVENTION

Figure 1A:
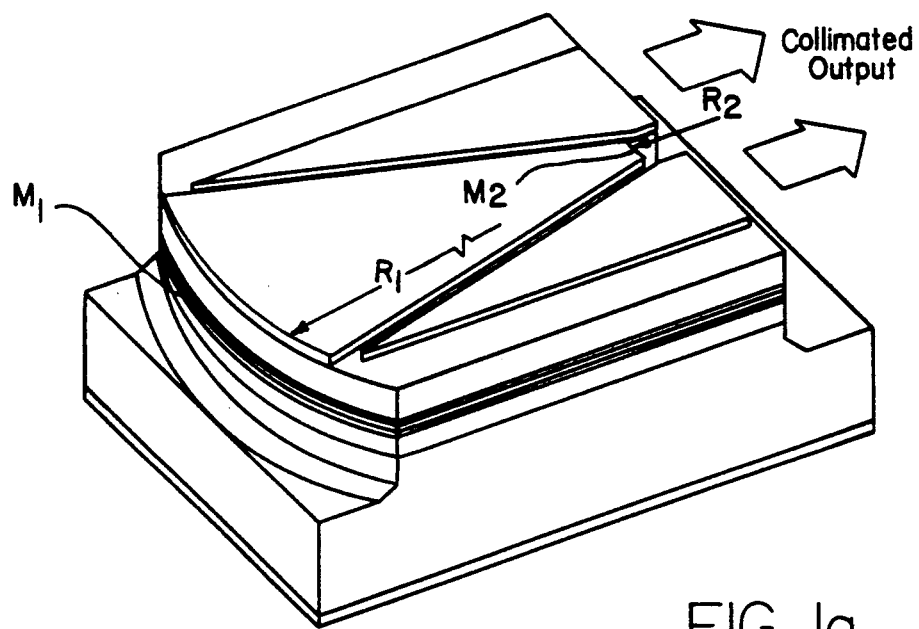
Figure 1B:
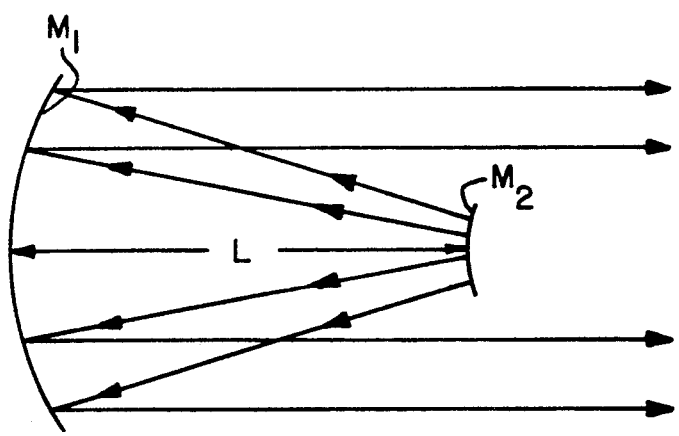
FIG. 1b illustrates the geometry of the unstable resonant diode of FIG. 1a to be compared with FIG. 5b.
Figure 2A:
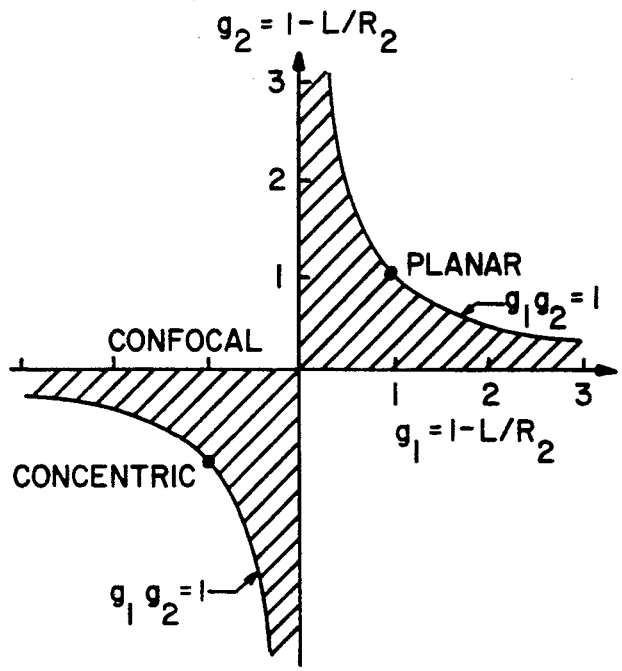
FIG. 2a is a mode chart from Siegman (1965) which summarizes the mode stability properties of a general optical resonator showing that resonators with g values well inside the shaded region are stable or low loss, and those well outside are unstable or high loss.
Figure 2B:
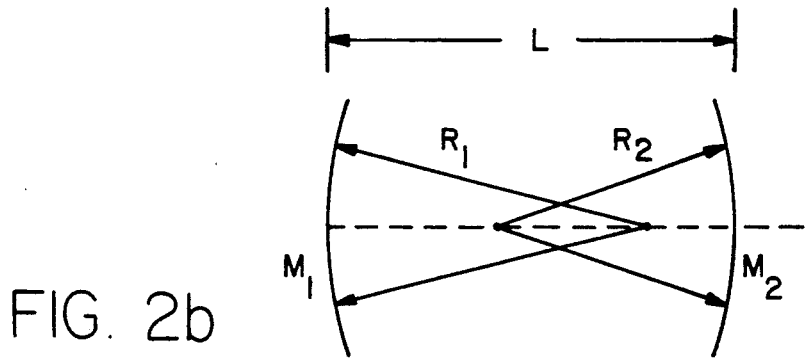
Figure 3:
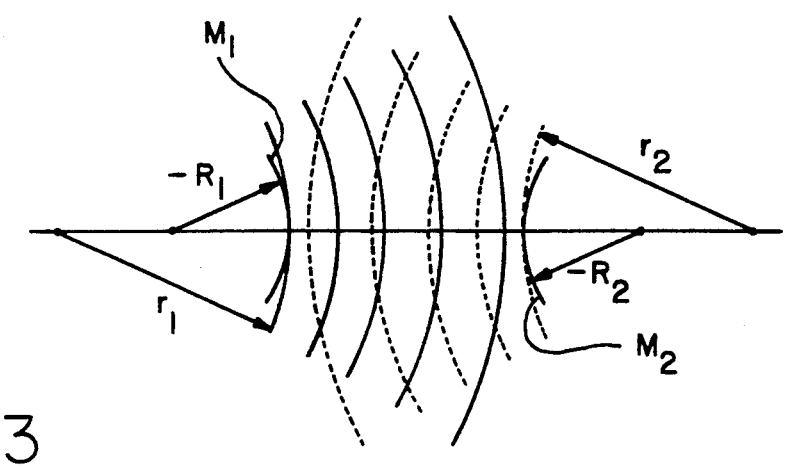
FIG. 3 illustrates in general the geometry of an unstable resonator showing the radii $R_1$ and $R_2$ of cavity mirrors $M_1$ and $M_2$, and showing the radii $r_1$ and $r_2$ of the counter-propagating beams of the respective mirrors $M_1$ and $M_2$.
Figure 4:
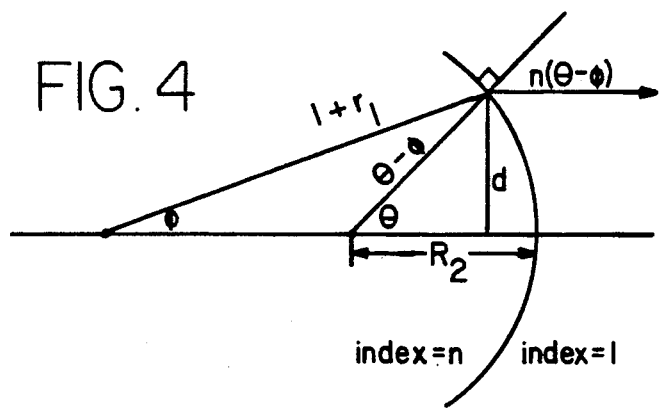
FIG. 4 is a ray diagram showing the refraction of a ray as it goes through a second mirror in a resonator cavity of radius $R_2$ for collimation as it exits the mirror.
Figure 5A:
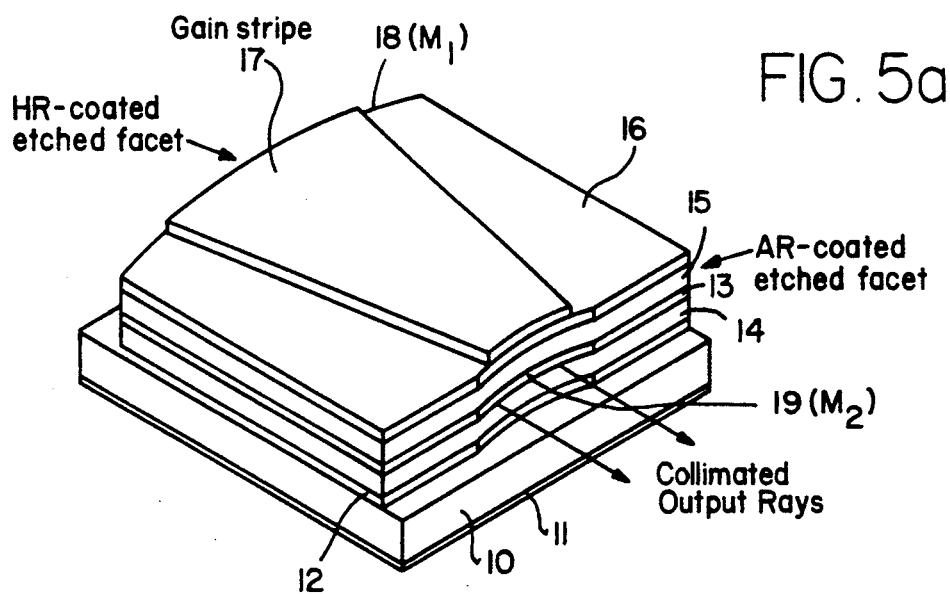
FIG. 5a is an isometric view of an unstable resonant semiconductor laser with a narrow collimated output beam in accordance with the present invention.

An example of a self-collimated unstable resonator diode laser will now be described with reference to FIG. 5a which shows a GaAs/AlGaAs double heterojunction structure epitaxially grown on an n+-GaAs substrate 10 typically 50 μm thick which is metallized on the back side to form a cathode contact 11. After growing a buffer layer 12 of n+-GaAs there is grown a thin ($\approx 0.5$ μm) p-type GaAs layer 13 sandwiched between n-type and p-type AlGaAs layers 14 and 15 which are of the order of 1 μm thick. A p+-GaAs cap layer 16 prepares the structure for metallization of a gain stripe (anode contact) 17. The active (emission) region is narrow in the vertical dimension due to the thinness of the central p-type GaAs layer 13 between the waveguide boundary layers 14 and 15 and is restricted in the horizontal plane by the shape of the gain stripe 17.

Figure 5B:
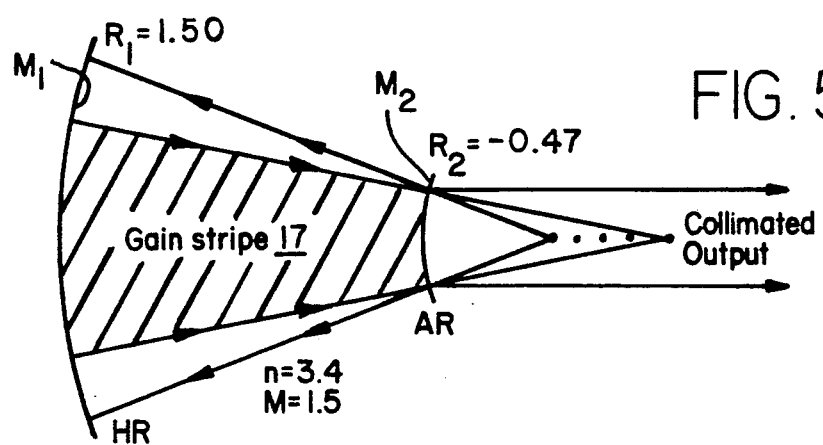

Fabrication of this double-heterojunction structure illustrated and described as an example is typical; what is unique is the shape of the etched facets 18 and 19 which are curved to form a large concave mirror $M_1$ and a small convex mirror $M_2$, as illustrated schematically in FIG. 5b, where the mirror radii $R_1$, $R_2$ are chosen according to Equations (1) through (12) and (13) with a value of magnification $M = 1.5$ and an effective index of refraction n of the heterojunction waveguide medium equal to 3.4. If the mirror radii and beam radii are chosen according to Equations (12) and (13), light rays exiting through mirror $M_2$ will be collimated by refraction across the index discontinuity at the exit. Collimation of the output rays is assured because the condition of Equation (9) is satisfied in the design and fabrication process. The gain stripe 17 is shaped to have converging edges from near the edges of the large high-reflection (HR) coated mirror $M_1$ along radial lines from a center of the curvature for the mirror $M_1$ to near the edges of the small, antireflection (AR) coated mirror $M_2$. To further restrict the emission region in the horizontal plane of the active layer 13, proton implantation may be provided in all of the active layer except that under the gain stripe 17.

Although a particular embodiment of the invention in a double heterostructure has been described and illustrated herein, it is recognized that any semiconductor stripe laser structure may be used to practice the invention by shaping the cavity mirrors as described. It is also recognized that the teachings for a 2-dimensional stripe laser may be readily extended to a 3-dimensional laser by the application of mathematical techniques forming 3-dimensional mirror surfaces by revolution of the 2-dimensional cavity mirrors, that is to say by forming mirror surfaces that form portions of spherical surfaces using the radius $R_1$ and $R_2$, once they are determined from Equation (12) that satisfies the condition of Equation (9) for self-collimation. Consequently, it is intended that the claims be interpreted to cover such modifications and equivalents.

What is claimed is:

1. A self-collimated unstable resonator semiconductor laser comprising a body of semiconductor material for emitting light in response to injected current, said semiconductor material having two opposing external surfaces shaped to form mirrors $M_1$ and $M_2$ of a resonant cavity, said mirror $M_1$ being of a concave shape of radius $R_1$ and the other surface mirror being of a convex shape of radius $R_2$, said radius $R_2$ being selected for said convex shape of mirror $M_2$ for collimation of output rays passing through said mirror $M_2$ by refraction as they exit said mirror $M_2$.

2. A self-collimated unstable resonator semiconductor laser as defined in by claim 1 wherein said semiconductor material has a known effective index of refraction n and said concave shape of mirror $M_1$ is chosen to have a radius $R_1$ greater than the radius $R_2$ of said convex mirror $M_2$, wherein said concave mirror $M_1$ produces a counterpropagating beam of radius $r_1$ in said body, and said convex shape of mirror $M_2$ is chosen to have a radius $R_2$ that satisfies a condition $$\frac{R_2}{1 + r_1} = \frac{n - 1}{n}.$$

3. A self-collimated unstable resonator semiconductor laser as defined in claim 2 wherein the geometric magnification M of beams reflected by said cavity mirrors $M_1$ and $M_2$ satisfies a condition $$1 \leq M \leq \frac{n + 1}{n - 1}.$$

4. A self-collimated unstable resonator semiconductor laser comprising a body of semiconductor material having an know index of refraction n, said semiconductor material emitting light in response to injected current and having two opposing external surfaces shaped to form mirrors $M_1$ and $M_2$ of a resonant cavity for said emitted light, said mirror $M_1$ being of a concave shape of radius $R_1$ for a counterpropagating beam of radius $r_1$ ad said mirror $M_2$ being of a concave shape of radius $R_2$ for a counterpropagating beam of radius $r_2$, said mirror radii $R_1$ and $R_2$ being chosen according to the following equations:

$$R_1 = \frac{\alpha^2 - 1}{\alpha(\alpha - n)}, R_2 = \frac{n\alpha - 1}{n\alpha}$$

and said beam radii $r_1$ and $r_2$ being chosen according to the following equations:

$$r_1 = \frac{1 - \alpha}{\alpha(1 - n)}, r_2 = \frac{1 - n\alpha}{\alpha(1 + n)}$$

where $\alpha = \beta/n$, $\beta \equiv 1 - g_2^{-1}$ and $g_2 \equiv 1 - 1/R_2$ with a value of geometric magnification $1 \leq M \leq (n+1)/(n-1)$ to satisfy a condition $$\frac{R_2}{1 + r_1} = \frac{n-1}{n}.$$

5. A self-collimated unstable resonator semiconductor laser as defined in claim 4 wherein said semiconductor material is GaAs in a GaAs/AlGaAs heterostructure, said known index of refraction is about 3.4, and said value of magnification is chosen to be between 1 and 1.833.

6. A self-collimated unstable resonator as defined in claim 5 wherein said magnification factor is chosen to be 1.5.

7. A self-collimated unstable resonator semiconductor laser comprising a large concave mirror $M_1$ and a small convex mirror $M_2$ on opposite surfaces of a semiconductor body of a material having an effective index of refraction n, where the respective mirror radii $R_1$, $R_2$ are chosen according to the following equations:

$$R_1 = \frac{\alpha^2 - 1}{\alpha(\alpha - n)}, \quad R_2 = \frac{n\alpha - 1}{n\alpha}$$

and beam radii $r_1$, $r_2$ are chosen according to the following equations:

$$r_1 = \frac{1 - \alpha}{\alpha(1 - n)}, \quad r_2 = \frac{1 - n\alpha}{\alpha(1 + n)}$$

where $\alpha = \beta/n$, $\beta \equiv 1 - g_2^{-1}$ and $g_2 \equiv 1 - 1/R_2$ with a value of geometric magnification $$1 \leq M \leq \frac{n+1}{n-1}$$

to satisfy a condition:

$$\frac{R_2}{1 + r_1} = \frac{n-1}{n},$$

where $r_1$ and $r_2$ are the radii of counterpropagating beams at respective mirrors of radii $R_1$ and $R_2$, for self-collimation of the output beam by refraction across discontinuity of the index of refraction at the exit of light rays from said convex mirror $M_2$.

* * * * *